United States Patent
Kusuda et al.

(10) Patent No.: US 6,496,973 B1
(45) Date of Patent: Dec. 17, 2002

(54) METHOD FOR DESIGNING MASK PATTERN OF A SELF SCANNING LIGHT EMITTING DEVICE

(75) Inventors: Yukihisa Kusuda, Osaka (JP); Shunsuke Ohtsuka, Osaka (JP); Seiji Ohno, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 68 days.

(21) Appl. No.: 09/831,110

(22) PCT Filed: Sep. 5, 2000

(86) PCT No.: PCT/JP00/06015

§ 371 (c)(1),
(2), (4) Date: May 4, 2001

(87) PCT Pub. No.: WO01/18868

PCT Pub. Date: Mar. 15, 2001

(30) Foreign Application Priority Data

Sep. 6, 1999 (JP) .............................. 11-251260
Sep. 9, 1999 (JP) .............................. 11-255582

(51) Int. Cl.⁷ ................. G06F 17/50; H01L 33/00; H01L 27/05; H01L 21/76; H01L 21/00
(52) U.S. Cl. .................. 716/19; 716/21; 716/20; 257/88; 257/79; 257/80; 257/91; 257/93; 257/99; 438/401; 438/22
(58) Field of Search .............. 716/40; 257/78, 257/88, 89

(56) References Cited

U.S. PATENT DOCUMENTS

| | | | | |
|---|---|---|---|---|
| 5,943,586 A | * | 8/1999 | Koizumi et al. | 257/97 |
| 6,180,960 B1 | * | 1/2001 | Kusuda et al. | 257/745 |
| 6,266,036 B1 | * | 7/2001 | Ohno | 316/169.1 |
| 6,323,887 B1 | * | 11/2001 | Shiraishi et al. | 347/115 |
| 6,384,429 B1 | * | 5/2002 | Ogihara et al. | 257/101 |
| 2001/0040620 A1 | * | 11/2001 | Wakisaka et al. | 347/263 |
| 2002/0030443 A1 | * | 3/2002 | Konuma et al. | 313/504 |
| 2002/0056847 A1 | * | 5/2002 | Uemura et al. | 257/89 |

FOREIGN PATENT DOCUMENTS

| | | | | |
|---|---|---|---|---|
| EP | 0 419 255 A | 3/1991 | | |
| JP | 63-133533 | 6/1988 | | |
| JP | 182925/1987 | 6/1989 | | |
| JP | 02263668 | 10/1990 | | |
| JP | 5-46282 | 2/1992 | | |
| JP | 9-092885 | 4/1997 | | |
| JP | 1125749 | * | 6/2000 | .............. B41J/2/45 |
| JP | 1167048 | * | 1/2001 | ......... H01L/33/001 |
| JP | 1182711 | * | 3/2001 | .......... H01L/33/00 |
| WO | WO97/12405 | 4/1997 | | |

OTHER PUBLICATIONS

Hatsumei Kyoukai koukai Gihous 96–7931, Japan Institute of Invention and Innovation, Jun. 17, 1996.
International PCT Search Report, Dec. 12, 2000.

* cited by examiner

Primary Examiner—Vuthe Siek
Assistant Examiner—Magid Y Dimyan
(74) Attorney, Agent, or Firm—RatnerPrestia

(57) ABSTRACT

A method of designing an optimum mask pattern for forming a metal line by an etching process, the metal line also effectively serving as a light-shielding layer, is provided. In this method, assuming that a mask pattern for forming a first metal line on a transparent insulating film has a width of "L1" overlapped with a first control electrode in a direction perpendicular to an array direction of of transfer elements, "L1" is selected so as to satisfy the following relation L1>(S+dS)+a, wherein "S" is the distance of side etching of the first metal line, "dS" is the dispersion of the distance of the side etching, and "a" is the misalignment of the mask pattern.

6 Claims, 5 Drawing Sheets

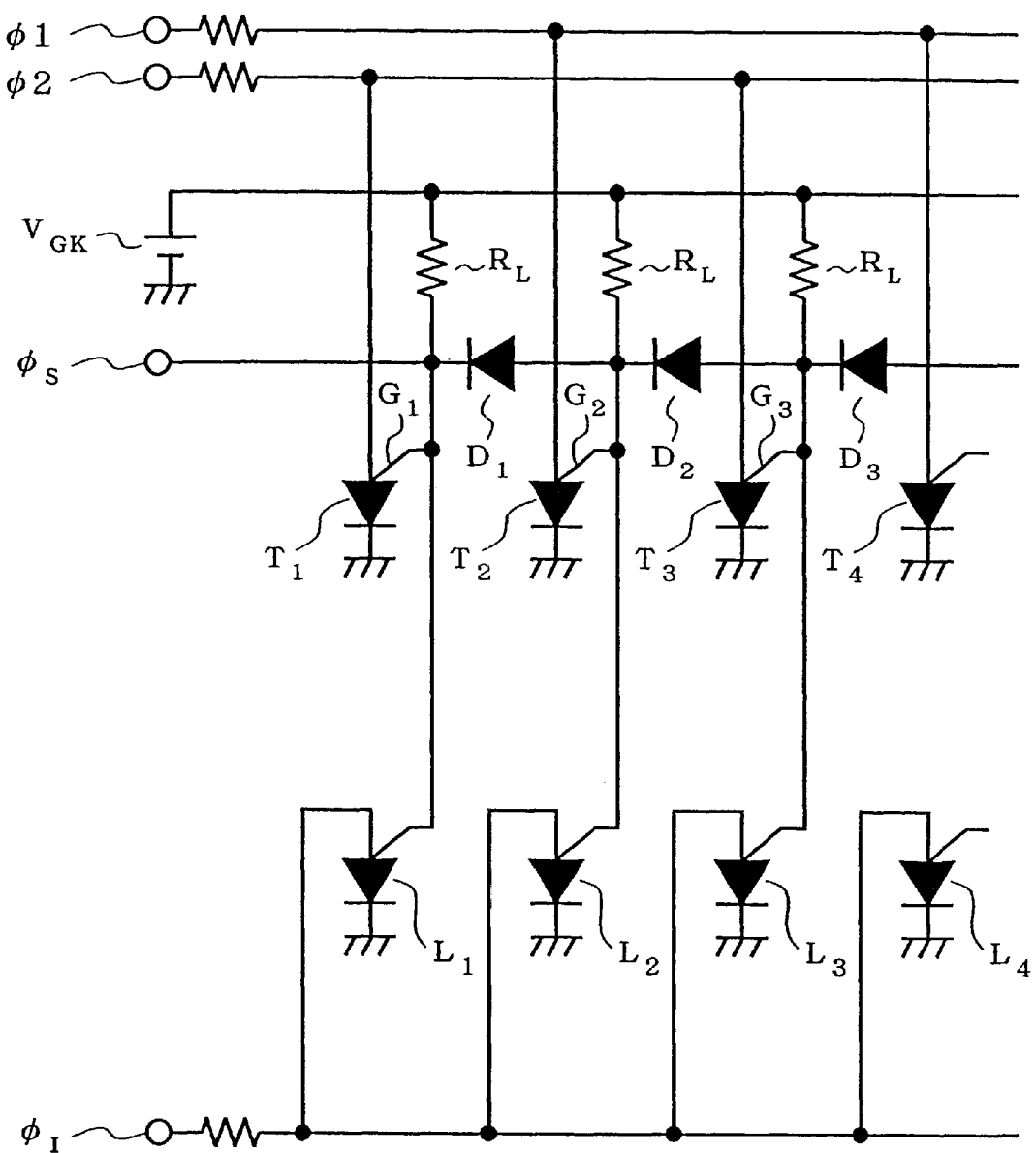
F I G. 1

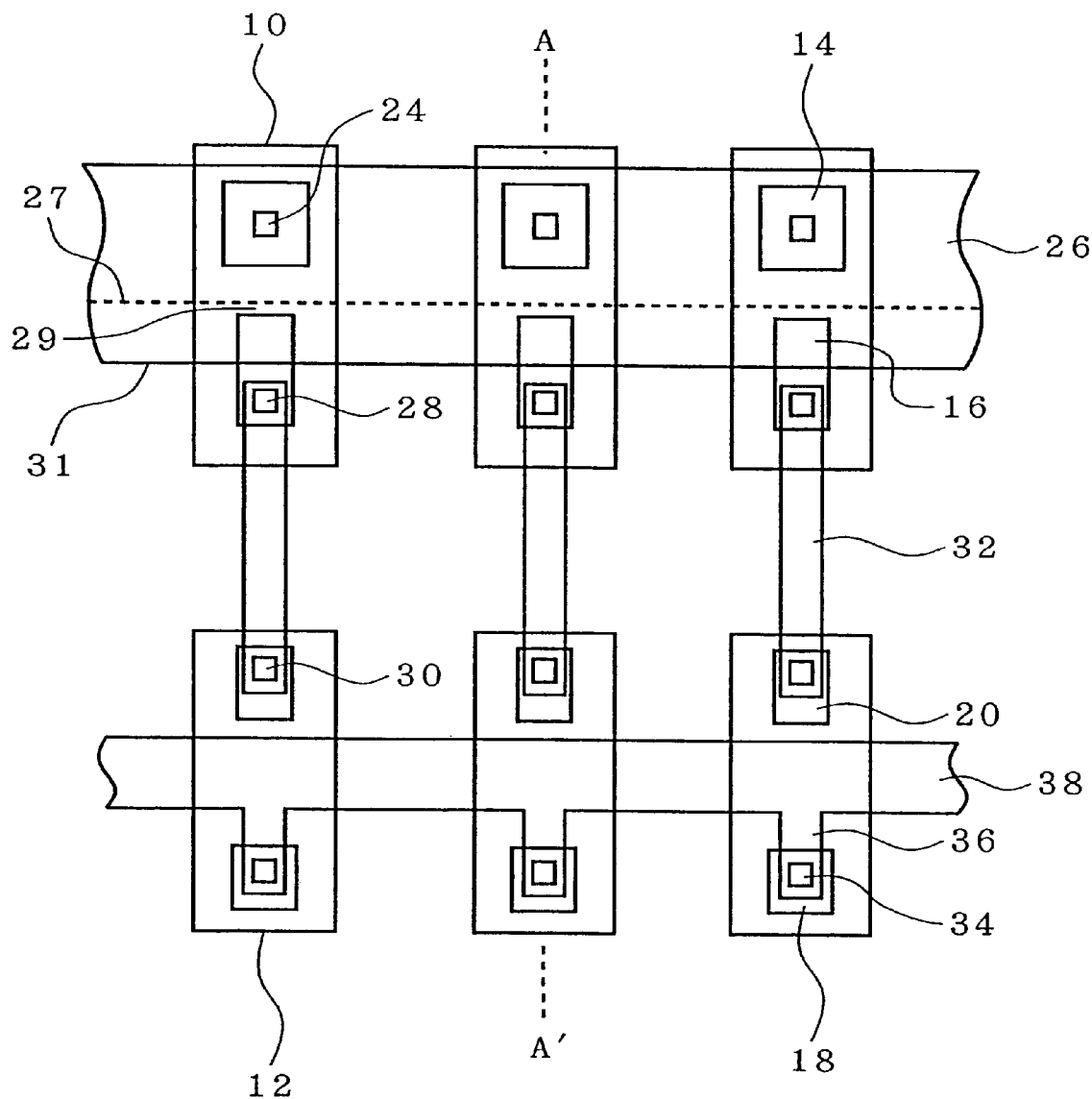
F I G. 2

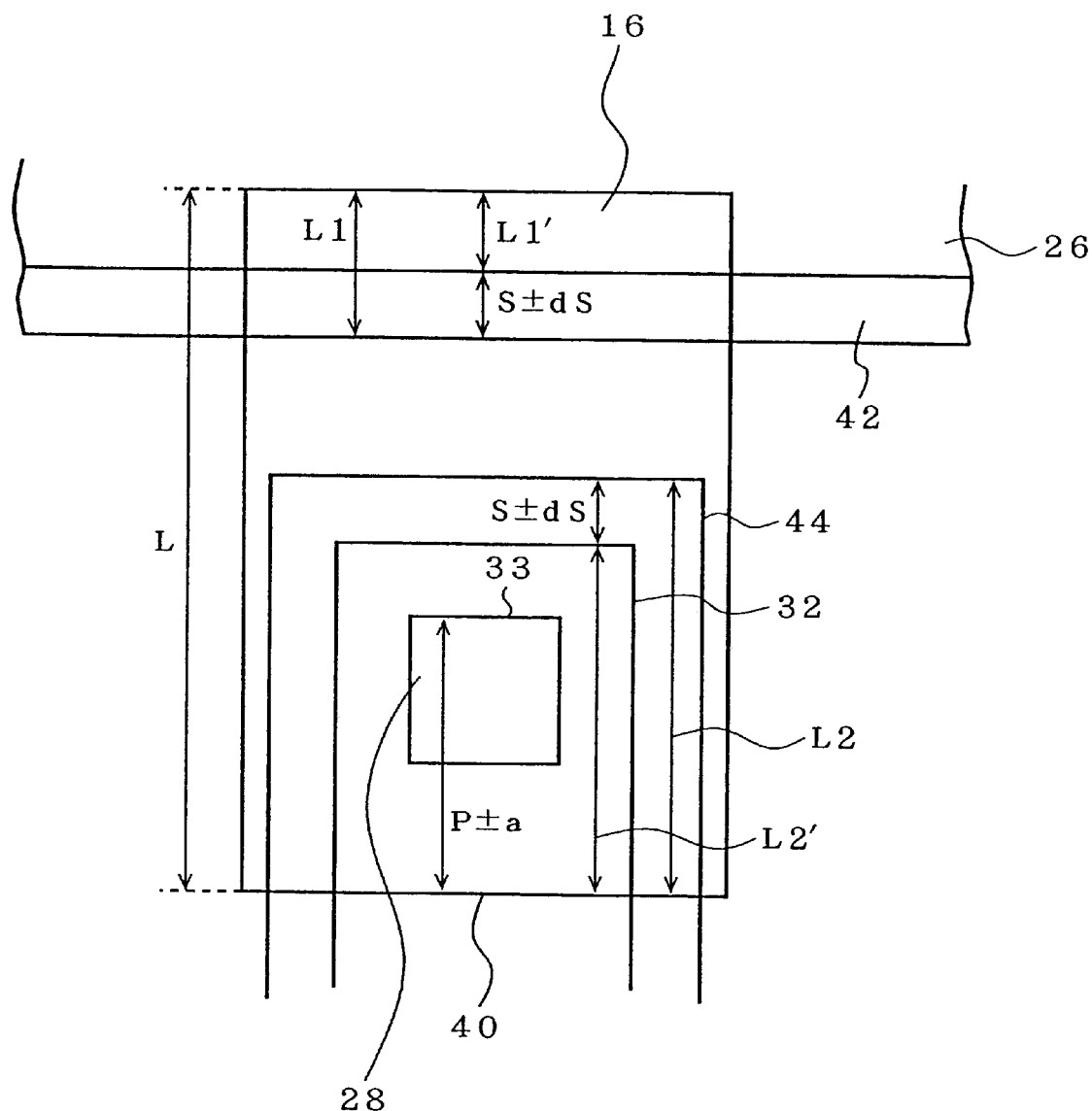
F I G. 4

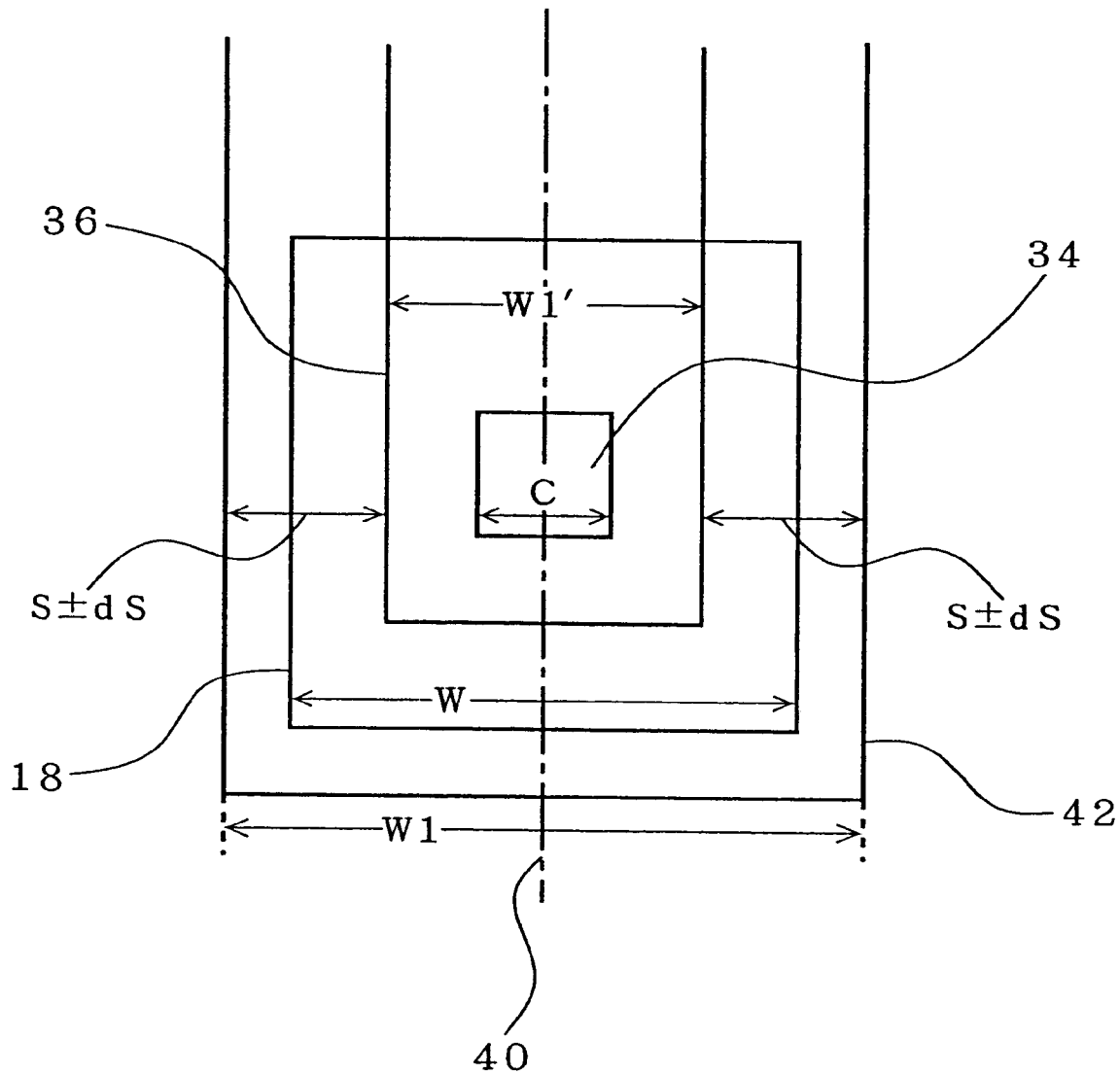
F I G. 5

METHOD FOR DESIGNING MASK PATTERN OF A SELF SCANNING LIGHT EMITTING DEVICE

TECHNICAL FIELD

The present invention relates to generally a self-scanning light-emitting device, particularly to a method of designing a mask pattern used in forming metal lines for a self-scanning light-emitting device.

BACKGROUND ART

A light-emitting device in which a plurality of light-emitting elements are arrayed on the same substrate is utilized as a light source of a printer, in combination with a driver circuit. The inventors of the present invention have interested in a three-terminal light-emitting thyristor having a pnpn-structure as an element of the light-emitting device, and have already filed several patent applications (see Japanese Patent Publication Nos. 1-238962, 2-14584, 2-92650, and 2-92651.) These publications have disclosed that a self-scanning function for light-emitting elements may be implemented, and further have disclosed that such self-scanning light-emitting device has a simple and compact structure for a light source of a printer, and has smaller arranging pitch of thyristors.

The inventors have further provided a self-scanning light-emitting device having such structure that an array of light-emitting thyristors having transfer function is separated from an array of light-emitting thyristors having writable function (see Japanese Patent Publication No. 2-263668.)

Referring to FIG. 1, there is shown an equivalent circuit diagram of a fundamental structure of this self-scanning light-emitting device. According to this structure, the device comprises transfer elements $T_1$, $T_2$, T3, ... and writable light-emitting elements $L_1$, $L_2$, $L_3$, ... , these elements consisting of three-terminal light-emitting thyristors. The structure of the portion of an array of transfer elements includes diode $D_1$, $D_2$, $D_3$, ... as means for electrically connecting the gate electrodes of the neighboring transfer elements to each other. $V_{GK}$ is a power supply (normally 5 volts), and is connected to all of the gate electrodes $G_1$, $G_2$, $G_3$, ... of the transfer elements via a load resistor $R_L$, respectively. Respective gate electrodes $G_1$, $G_2$, G3, ... are correspondingly connected to the gate electrodes of the writable light-emitting elements $L_1$, $L_2$, $L_3$, ... A start pulse $\phi_s$ is applied to the gate electrode of the transfer element $T_1$, transfer clock pulses $\phi 1$ and $\phi 2$ are alternately applied to all of the anode electrodes of the transfer elements, and a write signal $\phi_I$ is applied to all of the anode electrodes of the light-emitting elements.

The operation of this self-scanning light-emitting device will now be described briefly. Assume that as the transfer clock $\phi 1$ is driven to H (high) level, the transfer element $T_2$ is turned on. At this time, the voltage of the gate electrode $G_2$ is dropped to a level near zero volts from 5 volts. The effect of this voltage drop is transferred to the gate electrode $G_3$ via the diode $D_2$ to cause the voltage of the gate electrode $G_3$ to set about 1 volt which is a forward rise voltage (equal to the diffusion potential) of the diode $D_2$. On the other hand, the diode $D_1$ is reverse-biased so that the potential is not conducted to the gate $G_1$, then the potential of the gate electrode $G_1$ remains at 5 volts. The turn on voltage of the light-emitting thyristor is approximated to a gate electrode potential+a diffusion potential of PN junction (about 1 volt.)

Therefore, if a high level of a next transfer clock pulse $\phi 2$ is set to the voltage larger than about 2 volts (which is required to turn-on the transfer element $T_3$) and smaller than about 4 volts (which is required to turn on the transfer element $T_5$), then only the transfer element $T_3$ is turned on and other transfer elements remain off-state, respectively. As a result of which, on-state is transferred from $T_2$ to $T_3$. In this manner, on-state of transfer elements are sequentially transferred by means of two-phase clock pulses.

The start pulse $\phi_s$ works for starting the transfer operation described above. When the start pulse $\phi_s$ is driven to a low level (about 0 volt) and the transfer clock pulse 02 is driven to a high level (about 2–4 volts) at the same time, the transfer element $T_1$ is turned on. Just after that, the start pulse $\phi_s$ is returned to a high level. Assuming that the transfer element $T_2$ is in the on-state, the voltage of the gate electrode $G_2$ is lowered to almost zero volt. Consequently, if the voltage of the write signal $\phi_I$ is higher than the diffusion potential (about 1 volt) of the PN junction, the light-emitting element $L_2$ may be turned into an on-state (a light-emitting state).

On the other hand, the voltage of the gate electrode $G_1$ is about 5 volts, and the voltage of the gate electrode $G_3$ is about 1 volt. Consequently, the write voltage of the light-emitting element $L_1$ is about 6 volts, and the write voltage of the light-emitting element $L_3$ is about 2 volts. It follows from this that the voltage of the write signal $\phi_I$ which can write into only the light-emitting element $L_2$ is in a range of about 1–2 volts. When the light-emitting element $L_2$ is turned on, that is, in the light-emitting state, the amount of light thereof is determined by the amount of current of the write signal $\phi_I$. Accordingly, the light-emitting elements may emit light at any desired amount of light. In order to transfer on-state to the next element, it is necessary to first turn off the element in on-state by temporarily dropping the voltage of the write signal $\phi_I$ down to zero volts.

According to the circuit shown in FIG. 1, the cathodes of the light-emitting thyristors are connected to the ground, but it is apparent for those who skilled in the art that the anodes may be connected to the ground by opposing the polarity of the circuit.

In the self-scanning light-emitting device in which a transfer part and a light-emitting part are separated, the structure of the thyristor of the transfer part are substantially the same as that of the thyristor of the light-emitting part. Therefore, the thyristor used as the transfer element in the transfer part emits the light in its on-state. At this time, a large current as in the thyristor of the light-emitting part is unnecessary to be applied to the thyristor of the transfer part to drive it, i.e. a small fraction of current to be applied to the thyristor of the light-emitting part is applied. Therefore, the light output of the thyristor of the transfer part is smaller than that of the thyristor of the light-emitting part. As the timing of light emission in the thyristors of the transfer part is different from that in the thyristors of the light-emitting part, the light emission of the thyristors of the transfer part becomes a noise for the light emission of the light-emitting part when the self-scanning light-emitting device is used as a light print head. In order to suppress the noise, a light-shielding is required for the transfer part. The thyristors of the transfer part essentially have the structure for preventing the light from emitting outward. That is, the light is shielded by a metal (Al) line for applying a clock pulse. In this case, in order to make light shielding effective, it is required that the Al line is formed so as to be overlapped with the gate electrodes. The Al line is formed by depositing Al film and patterning it using a mask pattern in an etching process.

The thickness of the Al film is selected so thick as about 1 $\mu$m in order that the Al line is not discontinued at the steps on the surface of the elements. When such thicker Al line is patterned, the resulting size of patterned Al line varies widely, because the side etching to the Al line proceeds. Taking account of this variation of the size of resulting Al line and a mask pattern misalignment, it is required that a mask pattern size is designed in such a manner that the gap is not caused between the Al line and the gate electrode.

On the other hand, in the thyristors of the light-emitting part, the electrode for applying a write signal covers a part of light-emitting surface. Therefore, the structure is required such that the decrease of luminous efficiency is small and the light-emitting surface has a uniform light emission. For this purpose, an Au electrode is made ohmic contact with the center of the light-emitting surface of the thyristor, all of the light-emitting surface is covered by a transparent insulating film, a contact hole is formed in the insulating film, and the Al line is provided on the insulating film including the contact hole.

According to this structure, as the Au electrode is provided at the center of the light-emitting surface, the light emission at the light-emitting surface is uniform. Therefore, the decrease of the luminous efficiency may be prevented by decreasing an area of the Au electrode, for example 5 $\mu$m×5 $\mu$m square with respect to 20 $\mu$m×20 $\mu$m square of the light-emitting surface.

As the thickness of the Au electrode may have about 0.1 $\mu$m thickness, the electrode can be patterned with good accuracy (for example, less than ±0.5 $\mu$m). However, the thickness of the Al film is selected to about 1 $\mu$m so that the patterned Al line is not discontinued at the steps on the surface of the elements as described above. The patterning accuracy for such thicker Al film is not good (for example, about ±1 $\mu$m). This is because of side etching to the Al line during an etching process. Due to the variation of the width of resulting Al line, the width of the Al line may be larger than that of the Au electrode. In this case, the light output is decreased because of light shading by the Al line. In particular, when the self-scanning light-emitting device is used for a optical printer head, such decrease of the light output is a principal factor for the dispersion of light output among the light-emitting elements.

DISCLOSURE OF INVENTION

An object of the present invention is to provide a method of designing an optimum mask pattern for forming a metal line by an etching process, the metal line also effectively serving as a light shielding layer.

Another object of the present invention is to provide a method of designing a mask pattern for forming a metal line by an etching process so that the metal line has a width smaller than that of an ohmic electrode and larger than that of a contact hole.

According to the first aspect of the present invention, a method of designing a mask pattern for a self-scanning light-emitting device is provided. The self-scanning light-emitting device comprises a self-scanning transfer element array having such a structure that a plurality of three-terminal transfer elements each having a first control electrode for controlling threshold voltage or current are arranged, the first control electrodes of the transfer elements neighbored to each other are connected via first electrical means, a power supply line is connected to the first control electrodes via second electrical means, and a first metal line is connected to a first electrode which is one of two electrodes except the first control electrode of each of the transfer elements; a light-emitting element array having such a structure that a plurality of three-terminal light-emitting elements each having a second control electrode for controlling threshold voltage or current are arranged, the first control electrodes of the light-emitting elements are connected to the second control electrodes of the transfer elements by a second metal line, respectively, and a write signal metal line for applying a write current to a second electrode which is one of two electrodes except the second control of each of the light-emitting elements is provided; the first and second metal lines and the write signal metal line being formed by an etching process.

In this method, assuming that a mask pattern for forming the first metal line on a transparent insulating film has a width of "L1" overlapped with the first control electrode in a direction perpendicular to an array direction of the transfer elements, "L1" is selected so as to satisfy the following relation, $$L1>(S+dS)+a$$

wherein "S" is the distance of side etching of the first metal line, "dS" is the dispersion of the distance of the side etching, and "a" is the misalignment of the mask pattern.

According to the second aspect of the present invention, a method of designing a mask pattern for a self-scanning light-emitting device is provided. The self-scanning light-emitting device comprises a self-scanning transfer element array having such a structure that a plurality of three-terminal transfer elements each having a first control electrode for controlling threshold voltage or current are arranged, the first control electrodes of the transfer elements neighbored to each other are connected via first electrical means, a power supply line is connected to the first control electrodes via second electrical means, and a first metal line is connected to a first electrode which is one of two electrodes except the first control electrode of each of the transfer elements; a light-emitting element array having such a structure that a plurality of three-terminal light-emitting elements each having a second control electrode for controlling threshold voltage or current are arranged, the first control electrodes of the light-emitting elements are connected to the second control electrodes of the transfer elements by a second metal line, respectively, and a write signal metal line for applying a write current to a second electrode which is one of two electrodes except the second control of each of the light-emitting elements is provided; the first and second metal lines and the write signal metal line being formed by an etching process.

In this method, assuming that a mask pattern for forming the write signal metal line connected to the second electrode via a contact hole opened in a transparent insulating film is assumed to have a width of "W1" in an array direction of the light-emitting elements, "W1" is selected so as to satisfy the following relation, $$W+2(S+dS)+a>W1>C+2(S+dS)+2a$$

wherein "W" is a width of the second electrode in an array direction of light-emitting elements, "C" is the width of the contact hole in an array direction of the light-emitting elements, "S" is the distance of side etching of the write signal metal line, "dS" is the dispersion of the distance of the side etching, and "a" is the misalignment of the mask pattern.

BRIEF DESCRIPTION OF THE DRAWINGS

FIG. 1 is an equivalent circuit diagram of a fundamental structure of the self-scanning light-emitting device.

FIG. 2 is a schematic plan view of a self-scanning light-emitting device of the present invention.

FIG. 4 is an enlarged schematic plan view showing the positional relationship between the gate electrode of the transfer part and the Al line.

FIG. 5 is an enlarged schematic plan view showing the positional relationship among the cathode electrode, the contact hole, and the mask pattern for Al line.

BEST MODE FOR CARRYING OUT THE INVENTION

Figure 3:
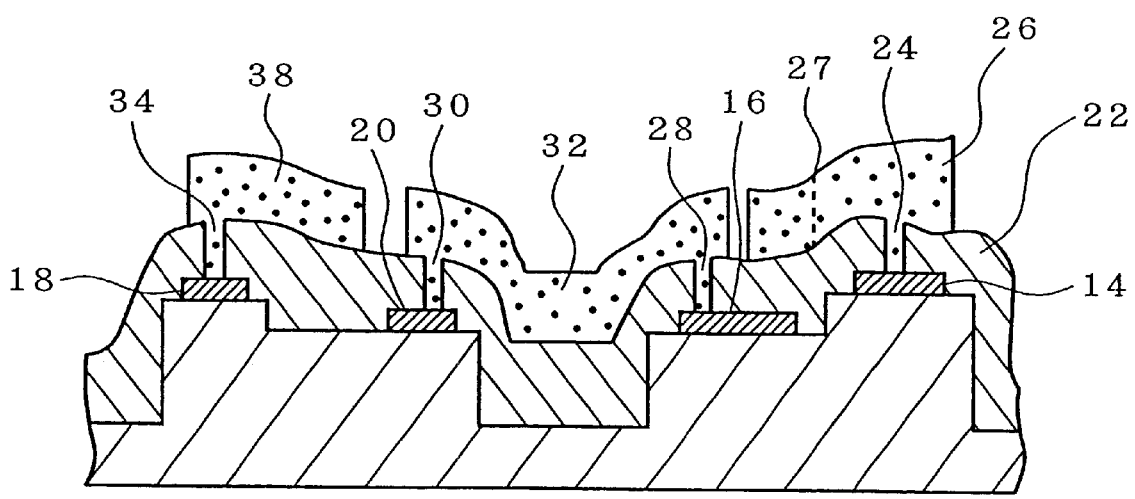
FIG. 3 is a sectional view taken along the line A–A' in FIG. 2.

An embodiment of the present invention will now be described with reference to the drawings.

Referring to FIG. 2, there is shown a schematic plan view of a self-scanning light-emitting device of the present invention. FIG. 3 is a sectional view taken along the line A–A' in FIG. 2. It should be noted that the self-scanning light-emitting device will be explained in which the polarity is inverted so that the anodes are grounded different from the equivalent circuit shown in FIG. 1.

In FIG. 2, reference numeral 10 designates a thyristor of a transfer part, and 12 a thyristor of a light-emitting part. These thyristors are fabricated by stacking a pnpn-structure on a semiconductor substrate.

The thyristor 10 of the transfer part is provided with a cathode electrode 14 and a gate electrode 16. The thyristor 12 of the light-emitting part is provided with a cathode electrode 18 and a gate electrode 20. These electrodes 14, 16, 18 and 20 are made of Au, for example.

On this structure, there is provided with a transparent insulating material 22 (see FIG. 3). The cathode electrodes 14 of the transfer part are connected by the Al line 26 via respective contact holes 24 opened in the insulating film 22. The Al line 26 is formed in a stripe-shape extending in an array direction of thyristors. Both of the gate electrodes 16 and 20 are connected to each other by the Al line 32 via the contact holes 28 and 30. The cathode electrode 18 of the light-emitting part is connected to an Al line 36 leading to an Al line 38. The Al line 38 is formed in a stripe-shape extending in an array direction of thyristors.

The stripe-shape Al line 26 of the transfer portion covers the cathode part of the thyristors 10. At this time, it is important to pattern Al film so that the resulting Al line 26 overlaps with the gate electrodes 16. If there are gaps between the Al line 26 and the gate electrodes 16, the light comes out through the gaps. In FIG. 2, the edge of the Al line 26 when the gaps are caused is designated by a dotted line 27, and the gaps by reference numeral 29.

In order not to cause such gaps, the Al line 26 must be formed so as to overlap with the gate electrodes, the edge of the Al line 26 being designated by a solid line 31 in FIG. 2.

As stated above, the thickness of the Al line 26 is selected to about 1 μm so that the Al line is not discontinued at the steps on the surface of the elements, resulting in a large dispersion of the size of patterned Al line. Therefore, the mask pattern design without causing the gaps described above is required while taking account of the dispersion of the size of resulting Al line and the misalignment of a mask pattern.

A method of designing the mask pattern for the Al line 26 will now be explained with reference to FIG. 4 which is an enlarged schematic plan view showing the positional relationship between the gate electrode 16 of the transfer part and the Al line 26.

Assume that the length of the gate electrode (Au electrode) 16 in a direction perpendicular to an array direction of the thyristors is designated by "L" as shown in FIG. 4. Since the gate electrode is formed by a lift-off method, the dispersion of the length "L" is small. While the contact hole 28 is opened using a mask pattern in the insulating film (not shown in FIG. 4) on the gate electrode 16, the dispersion of the size of the contact hole is small because the opening process is implemented by a dry etching process. The distance "P" of the edge 33 of the contact hole 28 near to the Al line 26 from the edge 40 of the gate electrode 16 far away from the Al line 26 is varied at most by ±a due to the misalignment of the mask pattern.

The Al lines 26 and 32 are formed by depositing Al film and patterning it by an etching process. At this time, assume that the overlap width between a mask pattern 42 for the Al line 26 and the edge part of the gate electrode 16 is "L1", and the overlap width between a mask pattern 44 for the Al line 32 and the opposite edge part of the gate electrode 16 is "L2".

The length "L" of the gate electrode 16 should satisfy the following relation.

$$L > L1 + L2 \quad (1)$$

Since the thickness of the Al film to be patterned is as thick as about 1 μm, the etching for the side of Al line, i.e. side etching is proceeded while an extra Al film is etched away by an etchant of phosphoric acid system using these mask patterns 42 and 44. Assuming that the distance of the side etching is "S", each overlap length between completed Al lines 26 and 32 and the gate electrode 16 is "L1'" and "L2'", respectively, as shown in FIG. 4. These L1' and L2' are represented by the following formulae taking into account of the dispersion ±dS of the side etching distance S;

$$L1' = L1 - (S \pm dS) \pm a \quad (2)$$

$$L2' = L2 - (S \pm dS) - (+a) \quad (3)$$

wherein the misalignment of respective mask patterns 42 and 44 is also assumed to be ±a.

In order to make the light shielding effective in the transfer port, which is one of the objects of the present invention, it is required that the Al line 26 necessarily overlaps with the gate electrode 16. This means that overlap width L1' must have a positive value. For this purpose, a condition required for L1 must be the following relation taking account of the worst case.

$$L1 > (S + dS) + a \quad (4)$$

On the other hand, a condition required for L2, which does not directly relate to the light shielding, satisfies the following relation based on the requirement for the overlapping of the Al line 32 with the contact hole 28.

$$L2' = L2 - (S + dS) - a > P + a \quad (5)$$

i.e., $$L2 > (S + dS) + P + 2a \quad (6)$$

An example of mask pattern design will now be described for fabricating transfer elements having the sizes "L" and "P" such as L=20μm and P=8 μm. Assuming that "S" is about 1 μm, "dS" is about 0.5 μm, and "a" is about 1 μm, these values are substituted for the formulae (4) and (6). As a result, L1 must be larger than 2.5 μm, and L2 must be larger than 11.5 μm. L1 and L2 satisfying these requirements are selected, and (L1+L2) is selected so as to be smaller than L(=20 μm).

A self-scanning light-emitting device was fabricated by using mask patterns having the selected sizes such as L1=4 μm and L2=12 μm. The amount of light of the thyristor of the transfer part is measured in the following manner. That is, the voltage of the write signal $\phi_I$ was held to the substrate potential so that the thyristor do not emit the light, the clock pulses $\phi1$ and $\phi2$ were applied to turn on the thyristors of the transfer part, and the amount of light was measured. The measured light output was smaller than 0.05 μW. Therefore, it is understood that the light shielding to the transfer part may be effected efficiently by using the mask patterns satisfying above described design condition.

Next, a method of designing a mask pattern used for patterning the Al line 36 which is connected to the cathode electrode 18 via the contact hole 34 will now be described with reference to FIG. 5 which shows the positional relationship among the cathode electrode 18, the contact hole 34, and a mask pattern 42 for the Al line 36.

As shown in FIG. 5, assume that the width of the cathode electrode (Au electrode) 18 in an array direction is "W". Since the cathode electrode is formed by a lift-off method, the dispersion of the width "W" is small. The contact hole 34 whose width is "C" is opened in the insulating film (not shown) in FIG. 5. The dispersion of the width C of the contact hole 34 is small because the opening thereof is implemented by a dry etching process. The position of the contact hole is varied at most by ±a from the center line 40 due to the misalignment of a mask pattern in an array direction of the thyristors. An Al film is then deposited, and the mask pattern 42 whose width is "W1" is provided on the structure. While an extra Al film is etched away by an etchant of phosphoric acid system using the mask pattern 42, the side etching of the Al line is proceeded. As a result of which, the width "W1'" of the completed Al line becomes smaller than the width "W1" of the mask pattern. Assuming that the distance of the side etching is "S" including the dispersion ±dS. Taking account of this, W1' is represented by the following formula.

$$W1'=W1-2(S\pm dS) \quad (7)$$

In order to suppress the dispersion of luminous efficiency among the light-emitting thyristors, which is one of the objects of the present invention, it is required that the Al line 36 does not go out of the gate electrode 18 in an array direction of the thyristors. For this purpose, the width W1' must be smaller than the width W. In fact, the alignment of the mask pattern 42 for Al line is varied at most ±a in the same way as the mask pattern for a contact hole, therefore a condition required for W1 must be the following relation taking account of the worst case.

$$W>W1-2(S+dS)-a \quad (8)$$

In this case, any one of the both side edges of the Al line 36 should not overlap with the contact hole 34 when the width of the Al line 36 becomes narrower. Taking account of this, the width W1 of the mask pattern 42 for the Al line is required to select so as to satisfy the following formula.

$$W>W1-2(S+dS)-a>C+a \quad (9)$$

The formula (9) may be rewrite as follows.

$$W+2(S+dS)+a>W1>C+2(S+dS)+2a \quad (10)$$

An example of mask pattern design will now be described for fabricating the light-emitting thyristors having the sizes "W" and "C" such as W=10 μm and C=3 μm, respectively. Assuming that "S" is about 1 μm, "dS" is about 0.5 μm, and "a" is about 1 μm, these values are substituted for the formula (9). As a result, W1 must be in a range of 9–14 μm. Light-emitting thyristors were fabricated using a mask pattern having the width W1 of 11.5 μm which is a center value of said range.

According to such design of mask pattern size, even if the width W1' of the patterned Al line 36 is varied, both side edges of the Al line 36 do not go out of the gate electrode 18. Therefore, the light is shaded only by the gate electrode having a stable size, resulting in a small dispersion of luminous efficiency. Where the dispersion M of the light outputs in an array of n light-emitting thyristors is defined as follows.

$$M = \frac{(\text{Max. light outpt} - \text{Min. light output})}{\text{Average light output}} \times 100 \ (\%)$$

While a typical value of the dispersion M for n=128 is about 15% to a conventional self-scanning light-emitting device, the dispersion is decreased to about 10% according to the device having the Al lines designed by the method of the present invention in the light-emitting part.

It would be apparent for those who skilled in the art that the method of designing a mask pattern for Al lines is applicable not only to light-emitting thyristors of the light-emitting part of the self-scanning light-emitting device but also conventional light-emitting diodes.

INDUSTRIAL APPLICABILITY

When a mask pattern for forming a metal line in a transfer part of the self-scanning light-emitting device is designed according to the method of the present invention, the first metal line necessarily overlaps with the first control electrode, resulting in no gap between the first metal and the first control electrode. Therefore, the amount of light coming out of the transfer elements becomes small.

Also, when a mask pattern for forming a write signal metal line in a light-emitting part of the self-scanning light-emitting device is designed according to the method of the present invention, the width of the write signal metal line may be smaller than that of an ohmic electrode. Therefore, it is possible to suppress the dispersion of luminous efficiency of the light-emitting elements.

What is claimed is:

1. A method of designing a mask pattern for a self-scanning light-emitting device comprising a self-scanning transfer element array having such a structure that a plurality of three-terminal transfer elements each having a first control electrode for controlling threshold voltage or current are arranged, the first control electrodes of the transfer elements neighbored to each other are connected via first electrical means, a power supply line is connected to the first control electrodes via second electrical means, and a first metal line is connected to a first electrode which is one of two electrodes except the first control electrode of each of the transfer elements; a light-emitting element array having such a structure that a plurality of three-terminal light-emitting elements each having a second control electrode for controlling threshold voltage or current are arranged, the first control electrodes of the transfer elements are connected to the second control electrodes of the light-emitting elements by a second metal line, respectively, and a write signal metal line for applying a write current to a second electrode which is one of two electrodes except the second control electrode of each of the light-emitting elements is provided; the first and second metal lines and the write signal metal line being formed by an etching process, characterized in that where a mask pattern for forming the first metal line on a transparent insulating film is assumed to have a width of "L1" overlapped with the first control electrode in a direction perpendicular to an array direction of the transfer elements, "L1" is selected so as to satisfy the following relation, $$L1>(S+dS)+a$$

wherein "S" is the distance of side etching of the first metal line, "dS" is the dispersion of the distance of the side etching, and "a" is the misalignment of the mask pattern.

2. The method of claim 1, wherein both of the three-terminal transfer element and the three-terminal light-emitting elements are three-terminal light-emitting thyristors.

3. The method of claim 1 or 2, wherein the first and second metal lines are Al lines.

4. A method of designing a mask pattern for a self-scanning light-emitting device comprising a self-scanning transfer element array having such a structure that a plurality of three-terminal transfer elements each having a first control electrode for controlling threshold voltage or current are arranged, the first control electrodes of the transfer elements neighbored to each other are connected via first electrical means, a power supply line is connected to the first control electrodes via second electrical means, and a first metal line is connected to a first electrode which is one of two electrodes except the first control electrode of each of the transfer elements; a light-emitting element array having such a structure that a plurality of three-terminal light-emitting elements each having a second control electrode for controlling threshold voltage or current are arranged, the first control electrodes of the transfer elements are connected to the second control electrodes of the light-emitting elements by a second metal line, respectively, and a write signal metal line for applying a write current to a second control electrode which is one of two electrodes except the second control of each of the light-emitting elements is provided; the first and second metal lines and the write signal metal line being formed by an etching process, characterized in that:

where a mask pattern for forming the write signal metal line connected to the second electrode via a contact hole opened in a transparent insulating film is assumed to have a width of "W1" in an array direction of the light-emitting elements, "W1" is selected so as to satisfy the following relation, $$W+2(S+dS)+a>W1>C+2(S+dS)+2a$$

wherein "W" is a width of the second electrode in an array direction of the light-emitting elements, "C" is the width of the contact hole in an array direction of the light-emitting elements, "S" is the distance of side etching of the write signal metal line, "dS" is the dispersion of the distance of the side etching, and "a" is the misalignment of the mask pattern.

5. The method of claim 4, wherein both of the three-terminal transfer element and the three-terminal light-emitting elements are three-terminal light-emitting thyristors.

6. The method of claim 4 or 5, wherein the first and second metal lines are Al lines.

* * * * *

UNITED STATES PATENT AND TRADEMARK OFFICE
CERTIFICATE OF CORRECTION

PATENT NO.    : 6,496,973 B1
DATED         : December 17, 2002
INVENTOR(S)   : Yukihisa Kusuda, Shunsuke Ohtsuka and Seiji Ohno It is certified that error appears in the above-identified patent and that said Letters Patent is hereby corrected as shown below:

<u>Title page,</u>
Item [57], ABSTRACT,
Line 7, "perpendicular to an array direction of of transfer elements" should read
-- perpendicular to an array direction of transfer elements --.

<u>Column 1,</u>
Line 37, "comprises transfer elements $T_1$, $T_2$, $T_3$..." should read -- comprises transfer elements $T_1$, $T_2$, $T_3$... --.
Line 46, "respectively. "Respective gate electrodes $G_1$, $G_2$, G3..." should read
-- Respective gate electrodes $G_1$, $G_2$, $G_3$... --.

<u>Column 2,</u>
Line 12, "level (about 0 volt) and the transfer clock pulse 02 is driven" should read
-- level (about 0 volt) and the transfer clock pulse $\phi 2$ is driven --.

<u>Column 6,</u>
Line 39, "L2'=L2-(S±dS)-(+a)" should read -- L2'=L2-(S±dS)-(±a) --.

<u>Column 9,</u>
Line 3, "formed by an etching process, characterized in that" should read -- formed by an etching process, characterized in that: --.

Signed and Sealed this

Twenty-sixth Day of August, 2003

JAMES E. ROGAN
*Director of the United States Patent and Trademark Office*